(12) United States Patent
Kim

(10) Patent No.: US 7,638,426 B2
(45) Date of Patent: Dec. 29, 2009

(54) SEMICONDUCTOR DEVICES AND METHODS OF MANUFACTURING THE SAME

(75) Inventor: Sung-Moo Kim, Seongnam (KR)

(73) Assignee: Dongbu Electronics Co., Ltd., Seoul (KR)

( * ) Notice: Subject to any disclaimer, the term of this patent is extended or adjusted under 35 U.S.C. 154(b) by 455 days.

(21) Appl. No.: 11/318,917

(22) Filed: Dec. 27, 2005

(65) Prior Publication Data

US 2006/0148245 A1 Jul. 6, 2006

(30) Foreign Application Priority Data

Dec. 30, 2004 (KR) .................. 10-2004-0117421

(51) Int. Cl.
*H01L 21/312* (2006.01)
*H01L 21/469* (2006.01)

(52) U.S. Cl. .................. 438/638; 438/618; 438/708

(58) Field of Classification Search .......... 438/618
See application file for complete search history.

(56) References Cited

U.S. PATENT DOCUMENTS 6,261,947 B1 * 7/2001 McTeer .................. 438/637
6,740,599 B2 * 5/2004 Yamazaki et al. .......... 438/739
7,241,684 B2 * 7/2007 Cho .................. 438/638

FOREIGN PATENT DOCUMENTS

KR 1998-026825 7/1998

OTHER PUBLICATIONS (Method of Forming a Contact Hole in a Semiconductor Device); Patent Abstract of Korea; Publication No. 1993-026825; Publication Date: Jul. 15, 1998.

* cited by examiner

*Primary Examiner*—Zandra Smith
*Assistant Examiner*—Pamela E Perkins
(74) *Attorney, Agent, or Firm*—The Law Offices of Andrew D. Fortney; Andrew D. Fortney

(57) ABSTRACT

Shorting of a copper line with an adjacent line in a semiconductor device during chemical mechanical polishing may be prevented and thus reliability of the semiconductor device may be improved, when the semiconductor device includes a substrate, an interlayer insulating layer formed on the substrate and having a dual trench, and a copper line formed to fill the dual trench, wherein the dual trench includes a first trench inclined at a first angle with respect to the substrate, and a second trench connected to the first trench and inclined at a second angle that is smaller than the first angle with respect to the substrate.

15 Claims, 2 Drawing Sheets

SEMICONDUCTOR DEVICES AND METHODS OF MANUFACTURING THE SAME

FIELD OF THE DISCLOSURE

The present disclosure relates to semiconductor devices and methods of manufacturing the same.

BACKGROUND

Recently, as semiconductor integrated circuits have become more highly integrated and their speed of operation has become higher, metal lines in a semiconductor device have become narrower and multi-layered. As the widths of the metal lines become narrower, the resistance and capacitance of the metal lines increase, thereby causing signal delay. Therefore, copper, a metal having low resistance, is used as a material for forming the metal lines to decrease this signal delay.

However, since copper is difficult to etch, copper metal lines are usually fabricated by a damascene process in which copper is first filled in a trench formed on a substrate and then planarized via chemical mechanical polishing.

Such a conventional method of manufacturing a semiconductor device using the damascene process may be summarized as follows.

As shown in FIG. 1, an interlayer insulating layer 12 is first formed on a substrate 10. A trench T is then formed in the interlayer insulating layer 12 by a selective etching process. Subsequently, a copper layer 14A is formed such that the trench T is filled thereby.

As shown in FIG. 2, a copper line 14 may be formed by applying chemical mechanical polishing to the copper layer 14A to confine the copper to the trench T.

However, after the chemical mechanical polishing, a serration shape may be formed on a surface of the copper line, which may cause a short circuit between adjacent copper lines such as is shown in the example of FIG. 2. Therefore, as a result of employing such a conventional method, reliability and yield of the manufactured semiconductor devices may be deteriorated.

Figure 1:
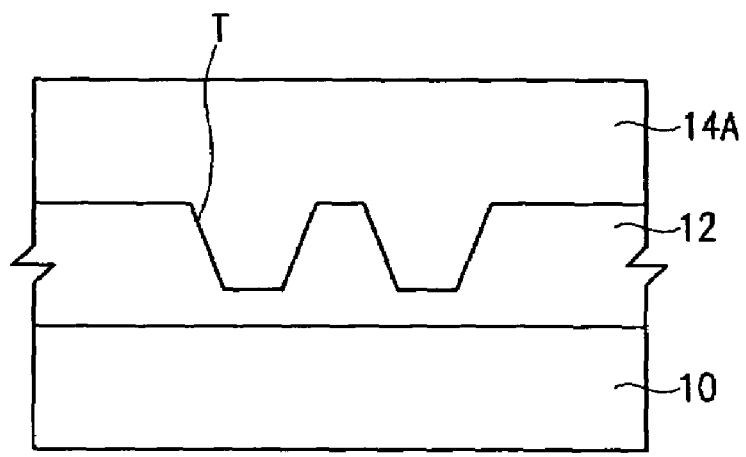
FIG. 1 and FIG. 2 are cross-sectional views showing a conventional method of manufacturing a semiconductor device.
Figure 2:
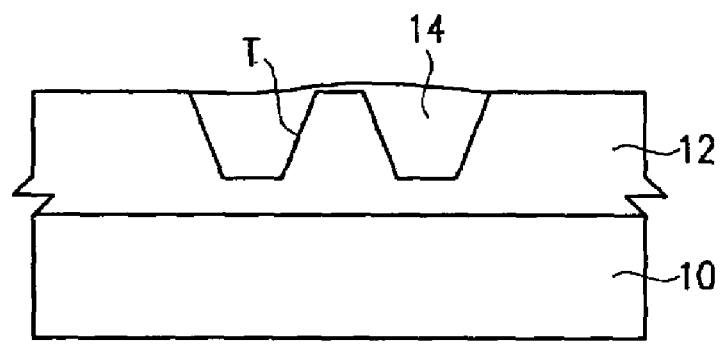

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Figure 3:
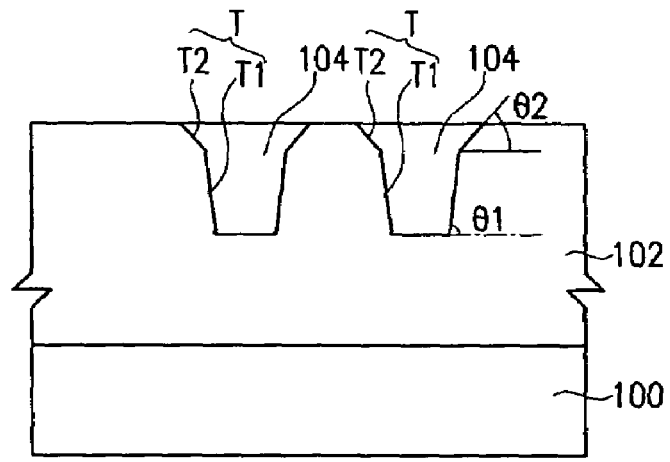
FIG. 3 is a cross-sectional view of an example semiconductor device constructed in accordance with the teachings of the present invention.

FIG. 3 is a cross-sectional view of an example semiconductor device constructed in accordance with the teachings of the present invention. As shown in FIG. 3, an interlayer insulating layer 102 is first formed on a substrate 100. In addition, a dual trench T is formed in the interlayer insulating layer 102. The dual trench T is then filled with copper to form a copper line 104.

Semiconductor structures (not shown) such as capacitors or transistors may have been formed on an active region of the substrate 100, and lower metal lines or plugs (not shown) may also have been formed on the substrate 100.

In the illustrated example, the dual trench T includes a first trench T1 and a second trench T2. A lateral side of the first trench T1 is inclined at a first angle $\theta 1$ with respect to the substrate 100. The second trench T2 is connected with the first trench T1, and a lateral side thereof is inclined at a second angle $\theta 2$ with respect to the substrate 100 such that the second trench T2 inclines more relative to the substrate 100 than the first trench T1, (i.e., the second angle $\theta 2$ is smaller than the first angle $\theta 1$).

Figure 4:
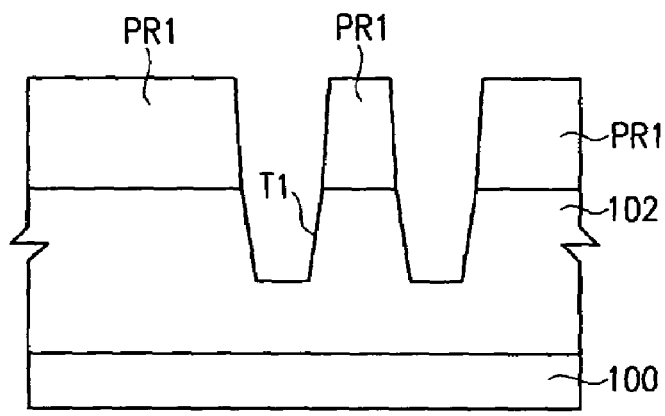
FIG. 4 and FIG. 5 are cross-sectional views showing an example method of manufacturing the semiconductor device shown in FIG. 3.
Figure 5:
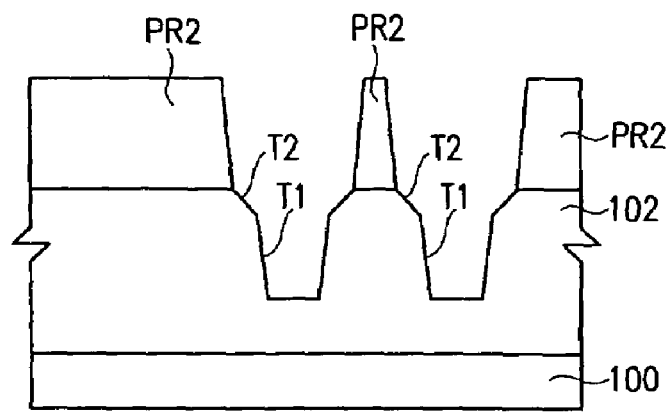

An example method of manufacturing such a semiconductor device will now be described with reference to FIG. 4 and FIG. 5. FIG. 4 and FIG. 5 are cross-sectional views showing the example method of manufacturing the semiconductor device shown in FIG. 3.

As shown in FIG. 4, the interlayer insulating layer 102 is formed by applying an insulating material on the substrate 100. Moreover, a first photosensitive layer pattern PR1 is formed on the interlayer insulating layer 102. The first trench T1 is then formed by etching the interlayer insulating layer 102 using the first photosensitive layer pattern PR1 as a mask.

As shown in FIG. 5, a second photosensitive layer pattern PR2 with a narrower width than the first photosensitive layer pattern PR1 is formed by again exposing and developing the first photosensitive layer pattern PR1. Furthermore, the second trench T2, which has a wider width than the first trench T1, is formed by again etching the interlayer insulating layer 102 using the second photosensitive layer pattern PR2 as a mask.

The lateral side of the second trench T2 inclines further toward the substrate 100 than that of the first trench T1, such that the width of the dual trench T becomes larger as one moves in a direction from the first trench T1 to the second trench T2.

As shown in FIG. 3, a copper layer is formed such that the dual trench T is fully filled thereby. In addition, a copper line 104 is confined in the dual trench T by applying chemical mechanical polishing to the copper layer.

As described above, the dual trench becomes wider in the upward direction. Such a structure may prevent a serration shape from being formed on the copper line, since the surface area of the copper line to be polished may increase. Accordingly, this shape may prevent a copper line from shorting with an adjacent line. Thus, device reliability may be improved.

From the foregoing, persons of ordinary skill in the art will appreciate that semiconductor devices and methods of manufacturing the same have been provided which prevent a copper line from shorting with an adjacent line during chemical mechanical polishing.

An example semiconductor device disclosed herein includes a substrate, an interlayer insulating layer formed on the substrate and having a dual trench, and a copper line formed to fill the dual trench. The dual trench includes a first trench inclined at a first angle with respect to the substrate, and a second trench in communication with the first trench and inclined at a second angle that is smaller than the first angle with respect to the substrate.

The dual trench may be formed such that a width thereof may become larger in an upward direction.

An illustrated example method of manufacturing a semiconductor device includes forming an interlayer insulating layer on a substrate, forming a first photosensitive layer pattern exposing a predetermined region of the interlayer insulating layer, forming a first trench by etching the interlayer insulating layer using the first photosensitive layer pattern as a mask, forming a second photosensitive layer pattern with a narrower width than the first photosensitive layer pattern by again exposing and developing the first photosensitive layer pattern, forming a second trench by again etching the interlayer insulating layer using the second photosensitive layer pattern as a mask, forming a copper layer on the interlayer insulating layer such that the first and second trenches are filled thereby, and applying chemical mechanical polishing to the copper layer.

The second photosensitive layer pattern may have a narrower width than the first photosensitive layer pattern.

A lateral side of the second trench may be inclined more toward the substrate than a lateral side of the first trench such that the dual trench becomes wider in an upward direction.

It is noted that this patent claims priority from Korean Patent Application Serial Number 10-2004-0117421, which was filed on Dec. 30, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a semiconductor device, comprising:
   forming an insulating layer above a substrate;
   forming a first photosensitive layer;
   exposing and developing the first photosensitive layer to form a first photosensitive layer pattern exposing a plurality of predetermined regions of the insulating layer;
   forming a plurality of first trenches each having a first sidewall with a first slope by etching the insulating layer using the first photosensitive layer pattern as a mask;
   forming a second photosensitive layer pattern by exposing and developing the first photosensitive layer pattern;
   forming a plurality of dual trenches by forming a second trench in each of the first trenches and aligned with the first trenches by etching the insulating layer using the second photosensitive layer pattern as a mask, each second trench having a second sidewall with a second slope that is smaller than the first slope of the first sidewall;
   forming a copper layer on the insulating layer such that the plurality of dual trenches are filled thereby; and
   chemical mechanical polishing the copper layer.

2. A method as defined in claim 1, wherein the second photosensitive layer pattern has a narrower width than the first photosensitive layer pattern.

3. A method as defined in claim 1, wherein the second sidewalls are inclined more toward the substrate than the first sidewalls are inclined toward the substrate.

4. A method as defined in claim 1, wherein:
   the second photosensitive layer pattern has a narrower width than the first photosensitive layer pattern; and
   lateral sides of the second trenches are inclined more toward the substrate than lateral sides of the first trenches are inclined toward the substrate such that the dual trench becomes wider in an upward direction.

5. A method as defined in claim 4, wherein forming the plurality of dual trenches prevents or reduces an incidence of a short circuit between adjacent copper lines.

6. A method as defined in claim 1, wherein forming the first photosensitive layer pattern comprises forming a plurality of holes in the first photosensitive layer exposing the predetermined regions of the insulating layer.

7. A method as defined in claim 6, wherein exposing and developing the first photosensitive layer pattern comprises widening the holes in the first photoresist layer to expose a surface of the insulating layer that was previously covered by the first photosensitive layer pattern.

8. A method as defined in claim 1, wherein upper ends of the second trenches are wider than upper ends of the first trenches.

9. A method as defined in claim 1, wherein the plurality of dual trenches are filled by the copper layer simultaneously.

10. A method as defined in claim 9, wherein chemical mechanical polishing the copper layer removes substantially all of the copper layer from an upper, horizontal surface of the insulating layer, including an area of the insulating layer between adjacent dual trenches.

11. A method as defined in claim 10, wherein adjacent dual trenches remain substantially filled with copper after the chemical mechanical polishing.

12. A method as defined in claim 9, wherein forming the plurality of dual trenches prevents or reduces an incidence of a short circuit between adjacent copper lines.

13. A method as defined in claim 1, wherein the insulating layer consists essentially of a single layer of insulating material.

14. A method as defined in claim 13, wherein forming the plurality of dual trenches prevents or reduces an incidence of a short circuit between adjacent copper lines.

15. A method as defined in claim 1, wherein forming the plurality of dual trenches prevents or reduces an incidence of a short circuit between adjacent copper lines.

* * * * *